United States Patent [19]

Abend

[11] 4,266,094
[45] May 5, 1981

[54] ELECTRONIC SPEECH PROCESSING SYSTEM

[76] Inventor: Irving J. Abend, 17 Clinton Park Dr., Bergenfield, N.J. 07621

[21] Appl. No.: 20,820

[22] Filed: Mar. 15, 1979

[51] Int. Cl.³ .................. H04B 1/10; H04B 15/00
[52] U.S. Cl. .................................. 179/1 D; 179/1 P; 328/169
[58] Field of Search .............. 179/1 D, 1 VL, 1 P; 328/22, 168, 169, 165; 455/308

[56] References Cited

U.S. PATENT DOCUMENTS

| | | | |
|---|---|---|---|
| 2,449,971 | 9/1948 | Andrews | 179/1 P |
| 3,292,116 | 12/1966 | Walker et al. | 179/1 P |
| 3,566,285 | 2/1971 | Schroeder | 328/169 |
| 4,103,243 | 7/1978 | Orban | 328/169 |
| 4,134,074 | 1/1979 | Hershberger | 328/169 |
| 4,166,924 | 9/1979 | Berkley et al. | 179/1 P |

*Primary Examiner*—Bernard Konick
*Assistant Examiner*—Randall P. Myers
*Attorney, Agent, or Firm*—Weingram & Klauber

[57] ABSTRACT

A system is disclosed for processing speech signals to enable effective power increase in a device utilizing the said signals. The system includes means for filtering an AF electrical signal analog of the speech signal, to thereby provide an AF signal including a narrow passed band of frequencies. The output from the filtering means are provided to means for symmetrically clipping the said output, to provide a series of pulses of constant amplitude, the discontinuities of which coincide with the zero axis crossings of the original AF signal. Sufficient amplification is provided at the filtering means to assure that the signal proceeding to the symmetrical clipping means is of sufficient amplitude in relation to the clipping level to enable the foregoing result. Reshaping low pass filter means receive the output from the symmetrical clipping means and sinusoidally reshape the said pulses. The signal from the reshaping low pass filter is provided to an additional limiting or clipping circuit, the function of which is to remove discontinuities which have been generated from the reshaping low pass filter. This further reduces distortion, thereby increasing articulation and intelligibility.

7 Claims, 2 Drawing Figures

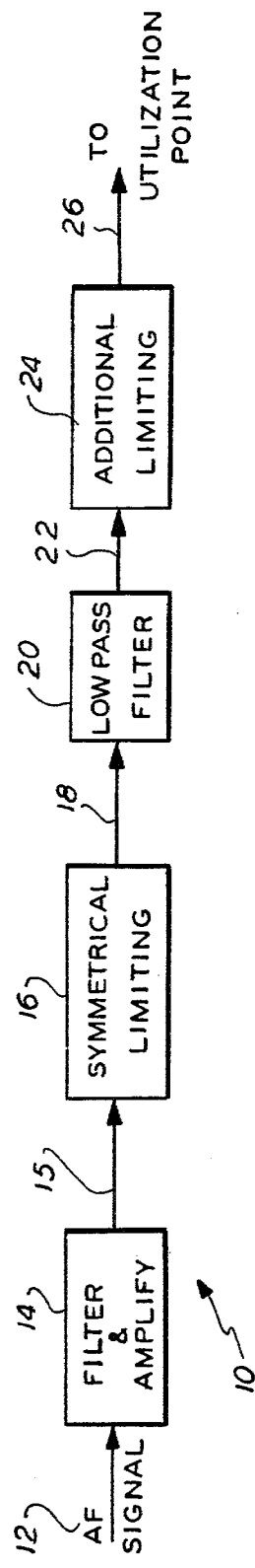
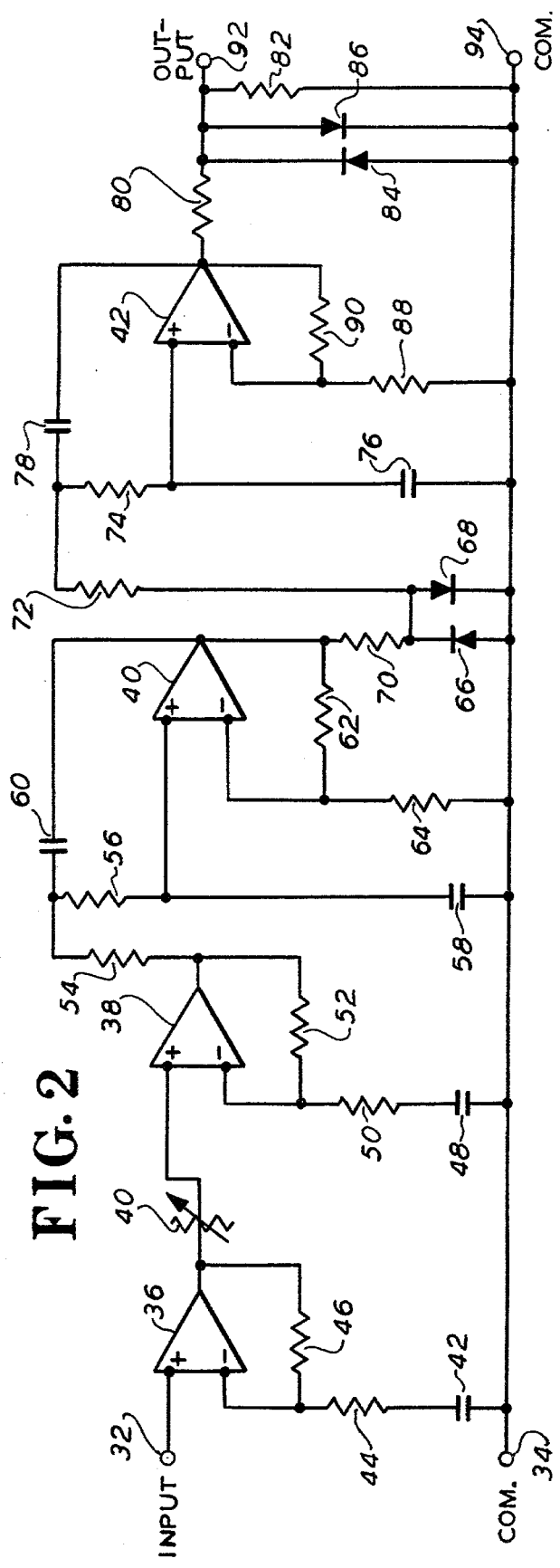

ELECTRONIC SPEECH PROCESSING SYSTEM

BACKGROUND OF INVENTION

This invention relates generally to electronic speech processing systems and methodology, and more specifically, relates to a system of the indicated type which enables effective power increases in devices such as audio amplifiers or transmitter-receiver systems.

As is well known in the pertinent art, human speech acoustically consists of voiced and unvoiced sounds. While the total spectrum of frequencies which are present in a normal speaking voice extend over a comparatively wide range, it has long been appreciated that relatively natural sounding speech can be reproduced with an electrical amplification system having a frequency bandwidth of as little as 300 to 3000 Hz, and a dynamic range of 40 Db (100 to 1).

A spectrogram of the human voice will show that spectral peaks called formants, occur in varying density from about 200 Hz up to 7000 Hz. Most of the voice energy, however, is found to reside between the 300 and 3000 Hz; additionally, it has further been found that for high articulation and intelligibility only the formants and unvoiced sounds from about 1000 Hz to 2500 Hz need actually be reproduced. Were appropriate frequency response shaping utilized, only about 17% of the available voice energy would accordingly be required to provide the same apparent speaking level.

While various techniques and systems have been proposed in the past in an effort to advantageously utilize the foregoing as to enable in simple fashion an increase in apparent effective power of sound reproducing devices and the like, by and large such prior art approaches have been only of limited success. Among other things e.g. in common prior art electronic speech reproduction systems, the average amplitude level is kept below the saturation or clipping level of the system to prevent distortion and to provide at least a 40 Db (100 to 1) dynamic range. This method, however, limits the average power of the system to much less than half that which could in principle actually be made available.

SUMMARY OF INVENTION

Now in accordance with the present invention, a system is disclosed for processing speech signals to enable effective apparent power increase in the device utilizing the said signals. Broadly, the system of the invention functions to accept an incoming AF signal analog of the speech signal, and first subject same to a frequency shaping—either by a band-pass filter or via successive high pass and low pass filters. The said filtering preferably concentrates the passed frequencies in the range from about 1000 to 2500 Hz. The output signal from the filtering is then subjected to an operation of signal limiting, more specifically of symmetrical clipping, to result in a series of pulses of constant amplitude, the discontinuities of which coincide with the zero axis crossings of the original AF signal. As appropriate, sufficient amplification may be provided at the filter or filters to assure that the signal proceeding to the symmetrical clipper is of sufficient amplitude in relation to the clipping level to enable the foregoing result.

As a result of the said operations, the high amounts of power that were formerly present at the relatively low and high frequencies, whereat their physiological value is very limited, has in effect been transferred to the narrow 1000 to 2500 Hz band, where the physiological effects are very high.

The output from the symmetrical clipper is preferably then provided to a reshaping means such as a low pass filter, which reshapes the relatively square wave pulses to sine waves, which augments articulation in the resultant signal, and also allows undistorted signal amplification through audio frequency stages of transmitters and audio amplifiers. The signal from the reshaping low pass filter, is preferably then provided to an additional limiting or clipping circuit, the function of which is to remove discontinuities which have been generated from the low pass filter, i.e. discontinuities representing overshoots or undershoots that may occur at the reshaping low pass filter. This further reduces distortion, thereby increasing articulation and intelligibility in the final AF signal. This final constant amplitude AF signal may, as discussed, then be provided to any appropriate utilizing device. Such device can be adjusted to operate at, but not to exceed its maximum output level.

BRIEF DESCRIPTION OF DRAWINGS

The invention is diagramatically illustrated, by way of example, in the drawings appended hereto, in which:

FIG. 1 is an electronic block diagram, schematic in nature, illustrating an electronic speech processing system in accordance with the present invention; and FIG. 2 is a schematic electrical diagram, in greater detail than FIG. 1, and illustrating a preferred embodiment of a system in accordance with the invention.

DESCRIPTION OF PREFERRED EMBODIMENT

In FIG. 1 herein, an electronic block diagram, simplified and schematic in nature, appears of an electronic speech processing system 10 in accordance with the present invention.

It may be initially considered that the signal to be processed by system 10 is an AF signal 12, which signal may be regarded as an electrical analog of a speech signal derived from any convenient source, such as e.g. from a microphone or similar transducer.

The AF signal 12 is initially provided to a filtering and amplifying means 14, the function of which is firstly to filter the high and low frequencies from AF signal 12, so as to result in a relatively narrow passed band of frequencies; and secondly, to amplify all of the thereby passed frequencies, so that a subsequent clipping of the output from means 14 will be effective in clipping substantially all of the passed signal to a common level, i.e. to produce a series of output pulses which will be of substantially square shape, and which will have constant amplitude.

Filter and amplification means 14 can comprise a band pass filter provided with appropriate amplification stages, or can comprise successive high pass and low pass filter means. The output from means 14 is preferably such that the frequencies present in the output signal 15 are substantially concentrated in the 1000 to 2500 Hz frequency range.

The output signal is then provided to a symmetrical limiting means 16, which as indicated, clips the said signal symmetrically, the amplification of the signal provided to means 16 being sufficient so that a series of pulses is provided at output 18, which are of constant amplitude, and the discontinuities of which coincide with the zero axis crossings of the original AF signal 12.

The clipped signal 18 is preferably then provided to a further reshaping means, which preferably takes the form of a low pass filter 20. The function of this latter element is one of restoring a sinusoidal shape to the said pulses, to thereby increase the articulation yieldable from such further modified signals.

The output 22 from the further reshaping low pass filter means 20 is then provided to a further limiting or clipping means 24, which preferably acts upon the signal 22 to limit same to the same level as does the limiting means 16. The function of this secondary limiting or clipping means 24 is one of removing discontinuities, i.e. spikes in the nature of overshoots or undershoots, which can be generated in consequence of passage of the signal through low pass filter means 20. Thus, this further limiting means 24 increases articulation to a yet higher level.

The final output from the system at 26, may then be utilized for conventional purposes as known in the art—as for example to modulate a transmitter or the like; or the said signal at 26 may be provided to a further amplification system, for example a P.A. system or the like.

Among other things, it will be appreciated that since the resulting output at 26 in the present system, includes signal levels of constant amplitude, the said signal can now be further amplified without requiring one to allow for signal excursions. This is to say that one can utilize the full power of any further amplification stage without any danger—whereas if the AF signal were not fixed in its amplitude excursions, one would have to take account of this, and operate well below the anticipated maximums for such excursions, thereby sacrificing the full capabilities of the amplification stage.

In FIG. 2 a schematic electrical diagram appears, which is considerably more detailed than the block diagram of FIG. 1, and which sets forth a preferred embodiment of a system in accordance with the invention.

In FIG. 2 it may be assumed that the AF signal input 12 is provided across input terminal 32 and common terminal 34. A series of operational amplifiers 36, 38, 40 and 42 are provided. Operational amplifiers 36 and 38 are configured as single-pole high pass filters, having gains of about 30 each at approximately 2500 Hz. The variable resistor 40 provided between amplifier 36 and amplifier 38 serves as a volume control to enable adjustment to various input levels. Capacitor 42, resistor 44, and resistor 46 are associated with the feedback loop of amplifier 36; capacitor 48, resistor 50 and resistor 52, are similarly associated with the feedback loop of amplifier 38. These resistors and capacitors can be varied to adjust the gain and frequency shaping (i.e. the response), up to 12 Db per octave.

Operational amplifier 40 serves as an active low pass filter, with resistor 54, resistor 56, capacitor 58 and capacitor 60 controlling the cut-off frequency. Resistors 62 and 64 in the feedback loop of amplifier 40 control the gain.

The output signal from amplifier 40 is seen to be clipped by means of the amplitude-limiting diodes 66 and 68, which are connected at the output of amplifier 40.

Operational amplifier 42 is a further, active low pass filter—which performs the reshaping function previously discussed, i.e. reshapes the output pulses as clipped by diodes 66 and 68 to a more sinusoidal shape. In this latter instance the resistors 70, 72 and 74—along with capacitors 76 and 78—determine the cut-off frequency.

The output from the low pass filter means represented by operational amplifier 42, is seen to be provided to a resistor divider circuit, including the resistors 80 and 82. Diodes 84 and 86 act as amplitude limiters, preferably limiting the amplitude as previously indicated, to the clipped level which is provided by means of diodes 66 and 68. The resistors 88 and 90 control the gain of amplifier 42.

As previously indicated, the final output from the system of FIG. 2, which is taken across output terminal 92, and common terminal 94, may now be provided to conventional utilization devices, such as an audio amplifier or a transmitter-receiver system—where in the latter instance the signal may be used e.g. to modulate a transmitter. It is found that by use of the present system, it is possible in representative instances to increase the speaking power well over ten times that obtainable in a conventional audio-amplifier or transmitter-receiver system. This effective power increase can further, be accomplished with better than 95% articulation for continuous speech, in consequence of which excellent intelligibility is enabled, with low apparent distortion.

While the present invention has been particularly set forth in terms of specific embodiments thereof, it will be understood in view of the instant disclosure, that numerous variations are now enabled to those skilled in the art, which variations are yet within the province of the instant teaching. Accordingly, the present invention is to be broadly construed, and limited only by the scope and spirit of the claims now appended hereto.

I claim:

1. A system for processing speech signals to enable undistorted signal amplification while providing high articulation and intelligibility in a predetermined band of frequencies, comprising:
    (a) means for filtering an AF electrical signal analog of said speech signal, to provide an output AF signal, including a narrow passed band of frequencies primarily in the range of from about 1000 to 2500 Hz;
    (b) means for symmetrically clipping the output from said filtering means, the signal level of said output being such in relation to said clipping level as to provide a series of pulses of constant amplitude, the discontinuities of which coincide with the zero axis crossings of the original AF signal;
    (c) reshaping low pass filter means for receiving the output from said symmetrical clipping means for sinusoidally reshaping said pulses; and
    (d) secondary limiting means for receiving the reshaped output of said low pass filter means, for clipping discontinuities generated by the low pass filter means from said output; and
each of means (a), (b), (c) and (d) being consecutively disposed in a single signal channel which is free of branch circuits for modifying the input signal presented to a said means.

2. A system in accordance with claim 1, wherein said filtering means includes amplifying means for raising the level of said AF signal provided to said clipping means.

3. A system in accordance with claim 2, wherein said filtering and amplifying means comprises a high pass filter followed by a low pass filter.

4. A system in accordance with claim 2, wherein said filtering and amplifying means comprises a band-pass filter.

5. A system in accordance with claim 3, wherein said high pass filter comprises two stages.

6. A system in accordance with claim 3, wherein said low pass filter comprising part of said filtering and amplifying means, comprises an operational amplifier; and wherein said symmetrical clipping means comprises a pair of diodes connected within the feedback loop of said operational amplifier.

7. A system in accordance with claim 1, wherein the secondary limiting means comprises a resistive divider circuit connected at the output of said reshaping low pass filter means, and a pair of diodes connected to said resistor divider circuit and across the output from said reshaping filter means.

* * * * *